United States Patent
Widdershoven

[11] Patent Number: 6,078,075
[45] Date of Patent: Jun. 20, 2000

[54] SEMICONDUCTOR DEVICE WITH A PROGRAMMABLE ELEMENT HAVING A P-TYPE SUBSTRATE AND FLOATING GATE WITH A THIN GATE DIELECTRIC

[75] Inventor: Franciscus P. Widdershoven, Eindhoven, Netherlands

[73] Assignee: U.S. Philips Corporation, New York, N.Y.

[21] Appl. No.: 09/028,430

[22] Filed: Feb. 24, 1998

[30] Foreign Application Priority Data

Feb. 27, 1997 [EP] European Pat. Off. ............. 97200577

[51] Int. Cl.[7] .................................................. H01L 29/788
[52] U.S. Cl. ............................................ 257/321; 257/316
[58] Field of Search ..................................... 257/314–326

[56] References Cited

U.S. PATENT DOCUMENTS

| | | | |
|---|---|---|---|
| 4,608,585 | 8/1986 | Keshtbod | 357/23.5 |
| 5,260,593 | 11/1993 | Lee | 257/316 |

FOREIGN PATENT DOCUMENTS 52-79883   7/1977   Japan.

Primary Examiner—David Hardy
Attorney, Agent, or Firm—Brian J. Wieghaus

[57] ABSTRACT

A very thin gate oxide is preferably used in non-volatile memories with floating gates for limiting the programming voltage. The minimum thickness of the gate oxide, however, is bound to certain limits in conventional memories because, if the oxide thickness is too small, the loss of charge from a programmed cell would become too great. The gate oxide is thicker than 7 nm in conventional memories for this reason. A non-volatile memory cell according to the invention comprises a gate oxide 9 with a thickness of no more than approximately 6 nm in combination with a p-type floating gate electrode 8. A lower programming voltage can be used thanks to the thin gate oxide, while a good data retention is maintained. The loss of charge is low because the electrons applied to the floating gate during programming recombine there with holes and are bound to the ionized acceptor atoms at a comparatively great distance from the interface between gate and oxide.

15 Claims, 1 Drawing Sheet

SEMICONDUCTOR DEVICE WITH A PROGRAMMABLE ELEMENT HAVING A P-TYPE SUBSTRATE AND FLOATING GATE WITH A THIN GATE DIELECTRIC

The invention relates to a semiconductor device with a programmable semiconductor element formed by a transistor with a floating gate and comprising a semiconductor body with a p-type surface region adjoining a surface, which programmable semiconductor element comprises a source and a drain in the form of n-type surface zones which are provided in the surface region and are mutually separated by an interposed channel region above which the floating gate is provided, said gate being separated from the surface of the semiconductor body by an interposed electrically insulating layer and being formed by a layer of doped semiconductor material.

In such a device, the programmable semiconductor element together with a smaller or larger number of identical elements may form a programmable, non-volatile memory such as an EPROM or EEPROM or FLASH EPROM. The memory may then be a stand alone memory or may be integrated with a large number of other circuit elements into an integrated signal processing circuit such as, for example, a microcontroller.

The floating gate in usual embodiments of an EPROM or EEPROM is formed by a layer of n-type doped polycrystalline silicon. A device in which the floating gate comprises p-type doped polycrystalline silicon is known inter alia from U.S. Pat. No. 5,260,593. In this known device, the usual n-type poly of the floating gate is replaced by p-type poly exclusively with the object of increasing the threshold voltage of the transistor.

Electrons are applied to the floating gate electrode during programming or writing of memory elements having floating gates, for which purpose, for example, the tunneling effect or hot charge carriers are used, so that these electrodes are electrically negatively charged and the threshold voltage of the transistor is raised. The charge state of the floating gate represents the written information. To read this information, it is ascertained whether the transistor is or is not conducting, given a certain voltage at the control electrode.

An important property of non-volatile memories is the data retention, which is defined as the time during which the written information is still present to a sufficient degree at the floating gate. In general, the leakage current which causes the electric charge to disappear from the floating gate should be so small that the memory can remain in use without re-writing during a period of several years (for example, ten years). To counteract the loss of electric charge at the floating gate owing to tunneling of electrons from the floating gate to the substrate, the gate dielectric should have a thickness greater than 7 nm in conventional memories. This again implies that a high voltage is required for programming so as to obtain the required electrical field strength in the gate dielectric.

This may cause problems in situations in which, for example, the supply voltage should be low, or in circuits where low breakdown voltages occur.

SUMMARY OF THE INVENTION

The invention has for its object inter alia to provide a semiconductor device of the kind described in the opening paragraph in which a much thinner gate dielectric is used compared with usual devices, while the data retention is maintained. According to the invention, such a semiconductor device is characterized in that, p-type semiconductor material being used for the floating gate, and the insulating layer between the floating gate and the surface of the semiconductor body having a portion which is less than approximately 7 nm.

The invention is based inter alia on the recognition that a programmed conventional cell with an n-type floating gate has free electrons in excess at its floating gate. Parts of these free electrons may be present adjacent the interface between poly and gate oxide in the form of an accumulation layer and may accordingly leave the floating gate by tunneling towards the substrate in the case of a sufficiently thin gate oxide. This leakage current results in a loss of charge at the floating gate, and thus in a limited data retention. To counteract this problem, it is necessary for the gate oxide of a conventional cell to have a thickness greater than 7 nm.

If a p-type floating gate is used, however, as in a device according to the invention, the electrons arriving at the floating gate during programming will recombine with free holes. This results in a negative space charge formed by ionized acceptors. These are not movable and are largely present at a greater distance from the poly-gate oxide interface than the free electrons at an n-type floating gate. Furthermore, the electrons in the ionized acceptors have a binding energy of approximately 1 eV with respect to the conduction band of Si. This renders the probability of electrons tunneling from the p-type floating gate to the substrate much smaller here than in an n-type floating gate, given an equal oxide thickness. As a result, the leakage current from a p-type floating gate will be smaller by some orders of magnitude than the leakage current from an n-type floating gate, at least within a given voltage range. This renders it possible to make the gate oxide thinner when a p-type floating gate is used, for example down to a thickness where the leakage current becomes comparable to that of a usual cell having an n-type floating gate. The thinner gate oxide has the advantage inter alia that the cell can be programmed or erased with a lower voltage, so that it is easier to realize the device in low-voltage processes and/or to combine the memory with a low-voltage circuit in a common integrated circuit. Preferably, the minimum thickness of the insulating layer between the surface of the semiconductor body and the floating gate is no more than 6 nm.

In versions such as OTP (One Time Programmable) and EPROM, in which the cell is not erased and is erased with UV radiation, respectively, it is possible to choose the doping concentration of the floating gate within wide limits because the cell cannot be erased electrically in these versions. The free electrons necessary for tunneling from the floating gate to the substrate are generated by optical means in the case of erasing with UV radiation. A further embodiment of a device according to the invention in which the cell can be erased electrically, as in an EEPROM and FLASH EPROM, is characterized in that the doping concentration of the floating gate electrode is so low that a layer of electrons can be formed at the interface between the floating gate electrode and the insulating layer through the application of suitable voltages for erasing stored information. Favorable results can be obtained in an embodiment in which the doping concentration of the floating gate electrode is at most approximately $1.5 \times 10^{19}$ atoms per $cm^3$.

BRIEF DESCRIPTION OF THE DRAWINGS

These and other aspects of the invention will be explained in more detail with reference to a few embodiments. In the drawing.

DESCRIPTION OF THE PREFERRED EMBODIMENTS

Figure 1:
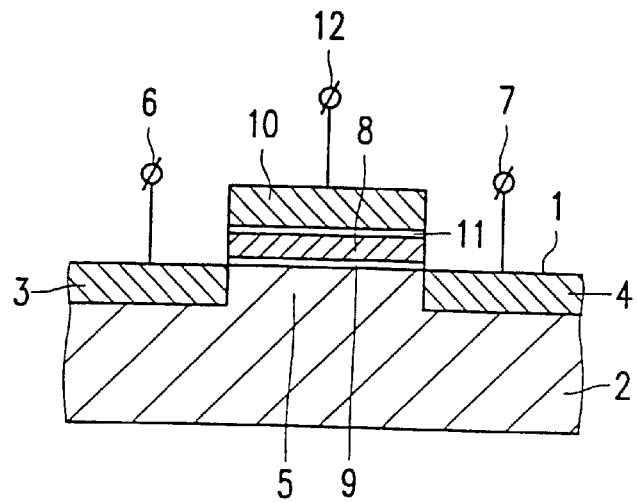
FIG. 1 is a cross-section of a first embodiment of a semiconductor device according to the invention.

FIG. 1 is a cross-section of a first embodiment of a semiconductor device according to the invention with a programmable semiconductor element in the form of a transistor with floating gate. The transistor only is shown in the drawing, but it will be obvious to those skilled in the art that the device may comprise a large number of other circuit elements in addition to the transistor. The device comprises a semiconductor body of silicon with a p-type surface region 2 adjoining the surface 1. The transistor comprises a source and a drain in the form of n-type surface zones 3 and 4, respectively, separated from one another by an interposed channel region 5. The zones 3 and 4 are provided with respective connections 6 and 7 which are shown in the drawing diagrammatically only. A floating gate 8 in the form of doped polycrystalline silicon (poly) is provided above the channel region 5 and is electrically insulated from the subjacent surface 1 by an electrically insulating silicon oxide layer 9. The thickness of the oxide layer is approximately 6.0 nm. The transistor in this example is in addition provided with a control electrode 10 above the floating gate 8, electrically insulated therefrom by a dielectric layer 11. The layer 11 may comprise a single silicon oxide layer or may be composed of a multiple layer of, for example, silicon oxide and silicon nitride, or may comprise a layer of oxynitride. The control electrode 10, which may be made of poly or of a metal, is provided with a connection 12 which is diagrammatically depicted.

Figure 2:
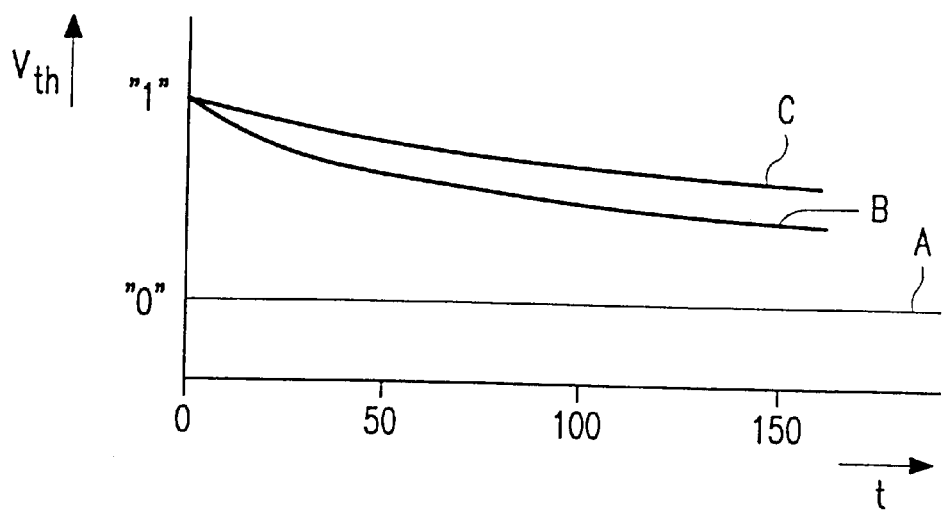
FIG. 2 plots the threshold voltage gradient as a function of time for a cell having an n-type floating gate and for a cell having a p-type floating gate.

During programming, electrons are brought from the substrate 2 through the oxide layer 3 onto the floating gate 8. The thickness of the oxide layer should be as small as possible to achieve an efficient charge transport, in particular with a view to low voltages and/or velocity. However, the charge at the floating gate will also disappear more quickly in proportion as the oxide thickness is smaller, so in practice the oxide thickness of the layer 9 is not smaller than approximately 7 nm to obtain an acceptable retention time in known memories. To illustrate this, FIG. 2 shows the retention at a temperature of approximately 250° C. of a conventional memory cell with an n-type floating gate and of a memory cell with a p-type floating gate, whose oxide thicknesses are the same. The threshold voltage is plotted on the vertical axis, and time t in hours on the horizontal axis. The threshold voltage $V_{th}$ practically does not change both in a conventional cell as in a cell having a p-type floating gate (curve A) when the cell is not programmed, i.e. contains information "0". The situation is different for the two cells when they are programmed, i.e. have information "1". The loss of charge in the conventional cell (curve B) is much greater than in the cell having a p-type floating gate (curve C). The thickness of the gate oxide should be chosen such that the difference between $V_{th}$ in the "1" state and $V_{th}$ in the "0" state remains sufficiently great for a sufficiently long period, for example a few years, at the normal operating temperature. Since the loss of charge in a cell with a p-type floating gate is much smaller than in one with an n-type gate, it is possible to reduce the thickness of the gate dielectric when a p-type gate is used and yet achieve the same retention as in a cell having an n-type gate. The electrons necessary for (electrical) erasing can be obtained by means of electric fields of higher values specific for erasing. If the p-type doping of the floating gate is chosen to be sufficiently low, a sufficient band bending can occur in the floating gate at said fields for achieving an acceptable concentration of electrons at the interface between the floating gate and the gate oxide. An n-type inversion layer may even arise with certain fields. These free electrons may be used during erasing for tunneling back to the substrate through the gate oxide and bringing the threshold voltage of the cell to its original low level again. To achieve this, the doping concentration in the p-type floating gate is preferably chosen to be not higher than $1.5 \times 10^{19}$ atoms per $cm^3$.

Figure 3:
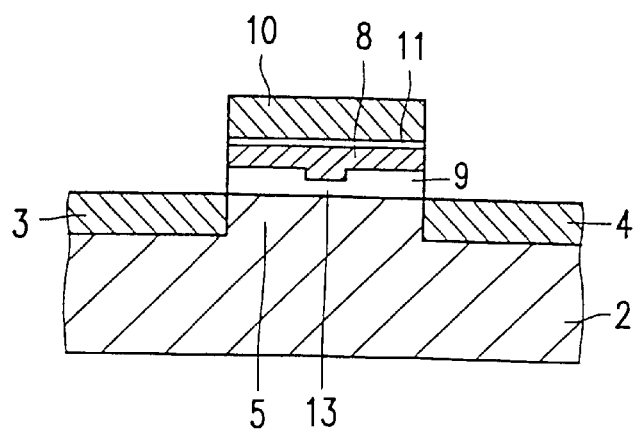
FIG. 3 is a cross-section of a second embodiment of a semiconductor device according to the invention.

In the embodiment shown in FIG. 1, the gate dielectric has a uniform thickness. FIG. 3 shows a modification where the gate dielectric 9 has a greater thickness for the major part, for example 8 nm, than the gate oxide 9 in FIG. 1, and is locally provided with very thin tunneling oxide 13 having a thickness of at most 6 nm. Electrons can be applied to the p-type floating gate by means of the tunneling mechanism through this oxide 13 during programming.

It will be obvious that the invention is not limited to the embodiments described here, but that many more variations are possible to those skilled in the art within the scope of the invention. Thus, for example, the gate oxide 9 between the source and drain zones 3 and 4 may have a uniform thickness of, for example, 8 nm in a modification of the embodiment of FIG. 3, while the floating gate 8 and the control electrode 10 extend outside the channel region above an injector region of the substrate which is separated from the p-type floating gate by a thin-tunneling oxide of 6 nm. The electrons necessary for erasing may alternatively be generated by optical means, for example by irradiation with UV. The invention may also be advantageously applied to so-called OTP devices (One Time Programmable), i.e. those which need not be erased anymore after being programmed.

What is claimed is:

1. A semiconductor device with a programmable semiconductor element comprising: a semiconductor body with a p-type surface region adjoining a surface, a source and a drain of n-type surface zones in the surface region and mutually separated by an interposed channel region, a floating gate above the channel region and the floating gate having a p-type semiconductor material, the floating gate being separated from the surface of the semiconductor body by an interposed electrically insulating layer that includes p-type doped semiconductor material, and wherein a portion of the insulating layer between the floating gate and the surface of the semiconductor body is less than 7 nm thick.

2. A semiconductor device as claimed in claim 1, wherein the thickness of the insulating layer is nonuniform and the minimum thickness of the insulating layer is no more than 6 nm.

3. A semiconductor device as claimed in claim 2, wherein the doping concentration of the floating gate electrode is so low that a layer of electrons can be formed at the interface between the floating gate electrode and the insulating layer through the application of suitable voltages for erasing stored information.

4. A semiconductor device as claimed in claim 3, wherein the doping concentration of the floating gate electrode is at most approximately $1.5 \times 10^{19}$ atoms per $cm^3$.

5. A semiconductor device as claimed in claim 1, wherein the doping concentration of the floating gate electrode is so low that a layer of electrons can be formed at the interface between the floating gate electrode and the insulating layer through the application of suitable voltages for erasing stored information.

6. A semiconductor device as claimed in claim 5, wherein the doping concentration of the floating gate electrode is at most approximately $1.5 \times 10^{19}$ atoms per cm$^3$.

7. An integrated circuit, comprising:

at least one programmable memory element comprising a) a semiconductor body having a surface, b) a p-type surface region adjoining said surface and defining a channel, c) first and second n-type surface regions adjoining said surface and bounding said channel region, said first and second n-type surface regions defining a source and a drain, respectively;

d) an insulating layer disposed on said surface of said semiconductor body; and e) a p-type semiconductor material disposed on said insulating layer opposite said channel and defining a floating gate, said insulating layer having a portion between said floating gate and said channel with a thickness less than 7 nm.

8. An integrated circuit according to claim 7, wherein said insulating layer has a thickness of less than 8 nm over the entire region of said floating gate and a thickness no more than 6 nm in a portion of the region.

9. A semiconductor device as claimed in claim 7, wherein the doping concentration of the floating gate electrode is so low that a layer of electrons can be formed at the interface between the floating gate electrode and the insulating layer through the application of suitable voltages for erasing stored information.

10. An integrated circuit, comprising:

at least one programmable memory element comprising a) a semiconductor body having a surface, b) a p-type surface region adjoining said surface and defining a channel, c) first and second n-type surface regions adjoining said surface and bounding said channel region, said first and second n-type surface regions defining a source and a drain, respectively;

d) an insulating layer disposed on said surface of said semiconductor body; and e) a p-type semiconductor material disposed on said insulating layer opposite said channel and defining a floating gate, said p-type semiconductor material of said floating gate having a doping concentration of at most $1.5 \times 10^{19}$ atoms/cm$^3$, said insulating layer having a portion between said floating gate and said channel with a thickness of 6 nm or less.

11. An integrated circuit according to claim 7, wherein said insulating layer has a thickness of less than 7 nm over the entire region of said floating gate.

12. A semiconductor device as claimed in claim 10, wherein the doping concentration of the floating gate electrode is so low that a layer of electrons can be formed at the interface between the floating gate electrode and the insulating layer through the application of suitable voltages for erasing stored information.

13. An integrated circuit according to claim 7, wherein said insulating layer has another portion with a greater thickness.

14. An integrated circuit according to claim 13, wherein said greater thickness is not less than 8 nm.

15. A semiconductor device with a programmable semiconductor element comprising: a semiconductor body with a p-type surface region adjoining a surface, a source and a drain of n-type surface zones in the surface region and mutually separated by an interposed channel region, a floating gate above the channel region, said gate including p-type semiconductor material and being separated from the surface of the semiconductor body by an interposed non-uniform electrically insulating layer and a layer of doped semiconductor material, and the insulating layer between the floating gate and the surface of the semiconductor body having a portion which is less than 7 nm thick and another portion and which is not less than 8 nm.

* * * * *